United States Patent [19]
Lerner et al.

[11] 3,982,111
[45] Sept. 21, 1976

[54] MEMORY DIAGNOSTIC ARRANGEMENT

[75] Inventors: Edward Mark Lerner, Glendale Heights, Ill.; David Cartwright Peterson, Neptune, N.J.; Terrence Thomas Quin, Holmdel, N.J.; Bernard George Ruel, Belmar, N.J.

[73] Assignee: Bell Telephone Laboratories, Incorporated, Murray Hill, N.J.

[22] Filed: Aug. 4, 1975

[21] Appl. No.: 601,477

[52] U.S. Cl. ........................................ 235/153 AM
[51] Int. Cl.² ....................................... G11C 29/00
[58] Field of Search .............. 235/153 AM, 153 AC, 235/153 AK; 340/174 ED; 445/1

[56] References Cited
UNITED STATES PATENTS

| | | | |
|---|---|---|---|
| 3,047,843 | 7/1962 | Katz et al. | 235/153 AM |
| 3,049,692 | 8/1962 | Hunt | 235/153 AM |
| 3,270,318 | 8/1966 | Strawbridge | 235/153 AM |
| 3,599,146 | 8/1971 | Weisbecker | 235/153 AM |
| 3,806,716 | 4/1974 | Lahti et al. | 235/153 AC |
| 3,814,922 | 6/1974 | Nibby et al. | 235/153 AK |
| 3,844,800 | 3/1976 | Beck et al. | 235/153 AM |

*Primary Examiner*—Charles E. Atkinson
*Attorney, Agent, or Firm*—M. S. Landis

[57] ABSTRACT

A diagnostic system is disclosed for detecting malfunctions in the access circuitry utilized to control the reading, writing, and refreshing of a plurality of semiconductor memory modules. More specifically, a pair of access circuits are provided for each module with each access circuit only controlling the accessing of predetermined bits of each word stored in that module. During read, write and refresh operations, the output signals generated by each of the two access circuits for application to the memory elements in that module are "compared" to ensure that the memory elements are being properly accessed. Moreover, even when one memory module is accessed, the output signals of each pair of access circuits in each of the other nonaccessed modules are compared to ensure their continued operability.

21 Claims, 11 Drawing Figures

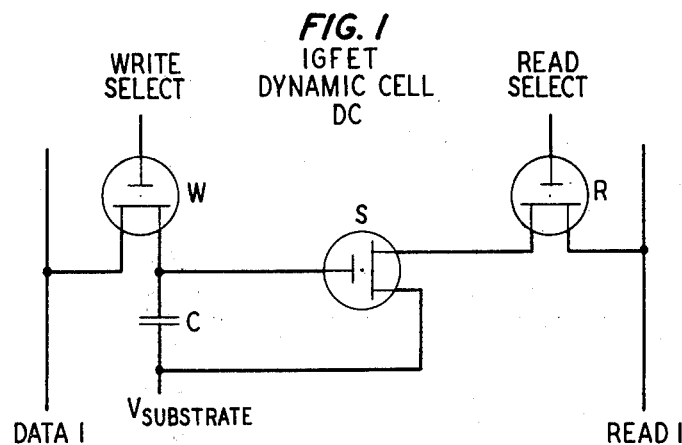
FIG. 1
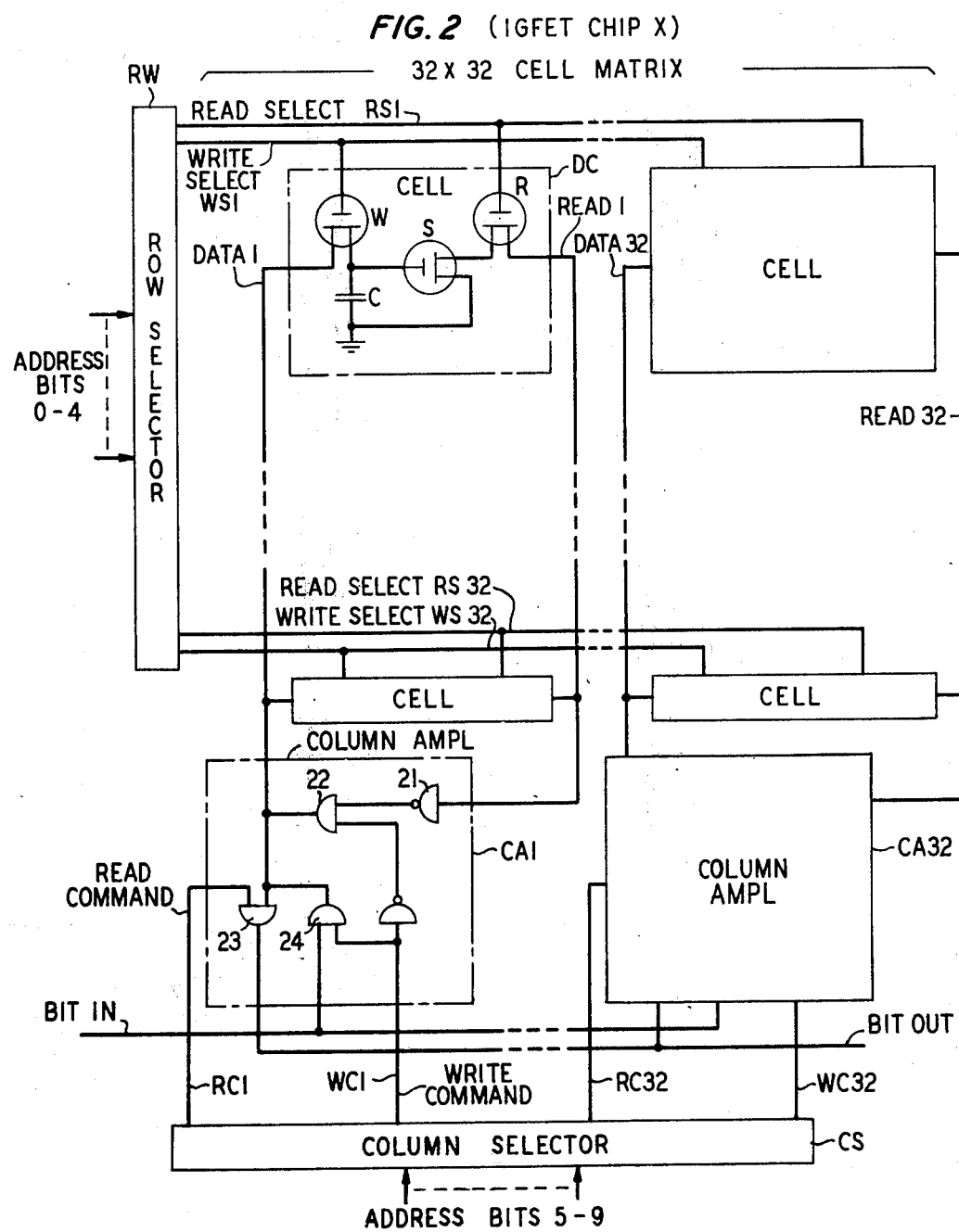
FIG. 2 (IGFET CHIP X)

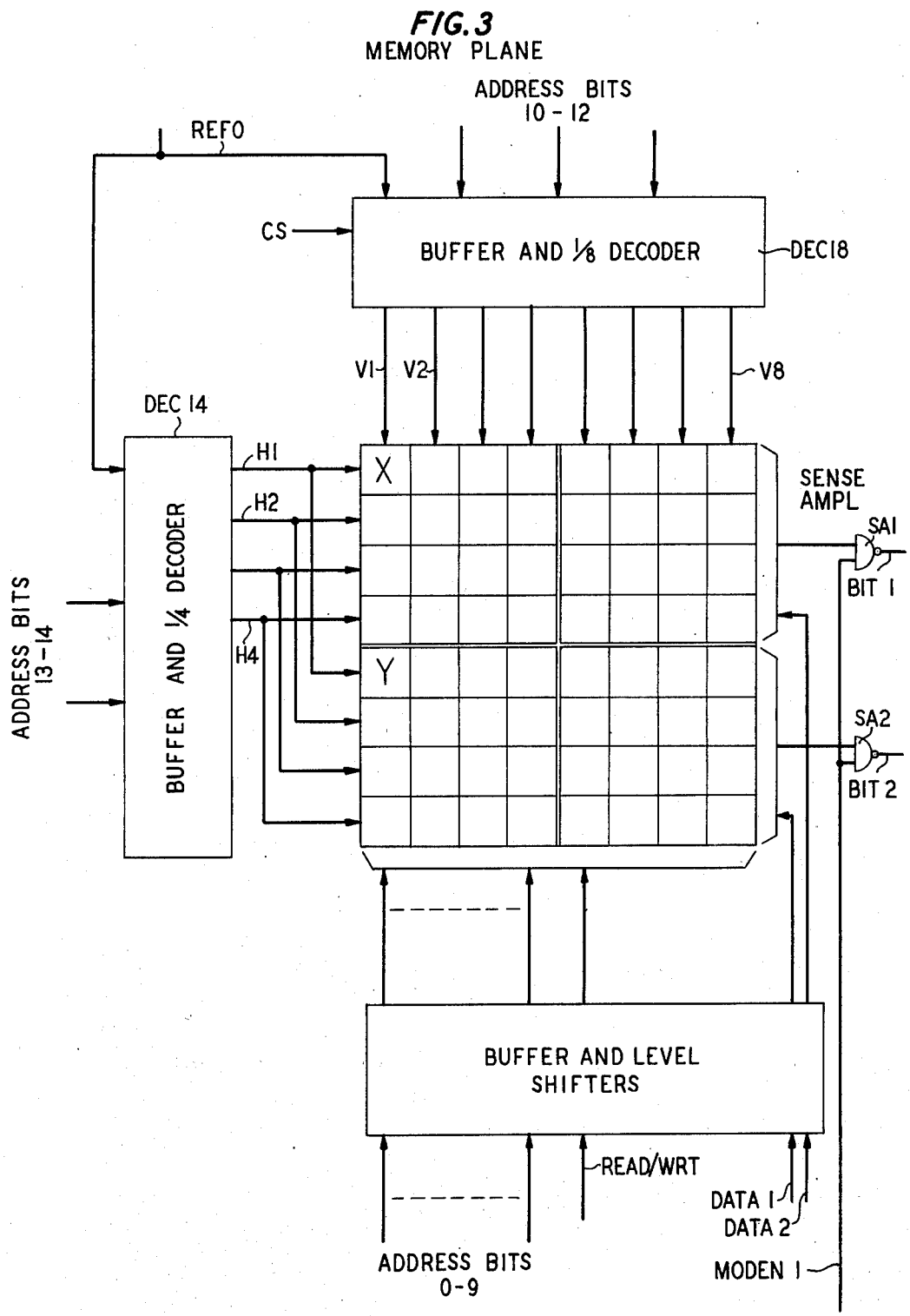

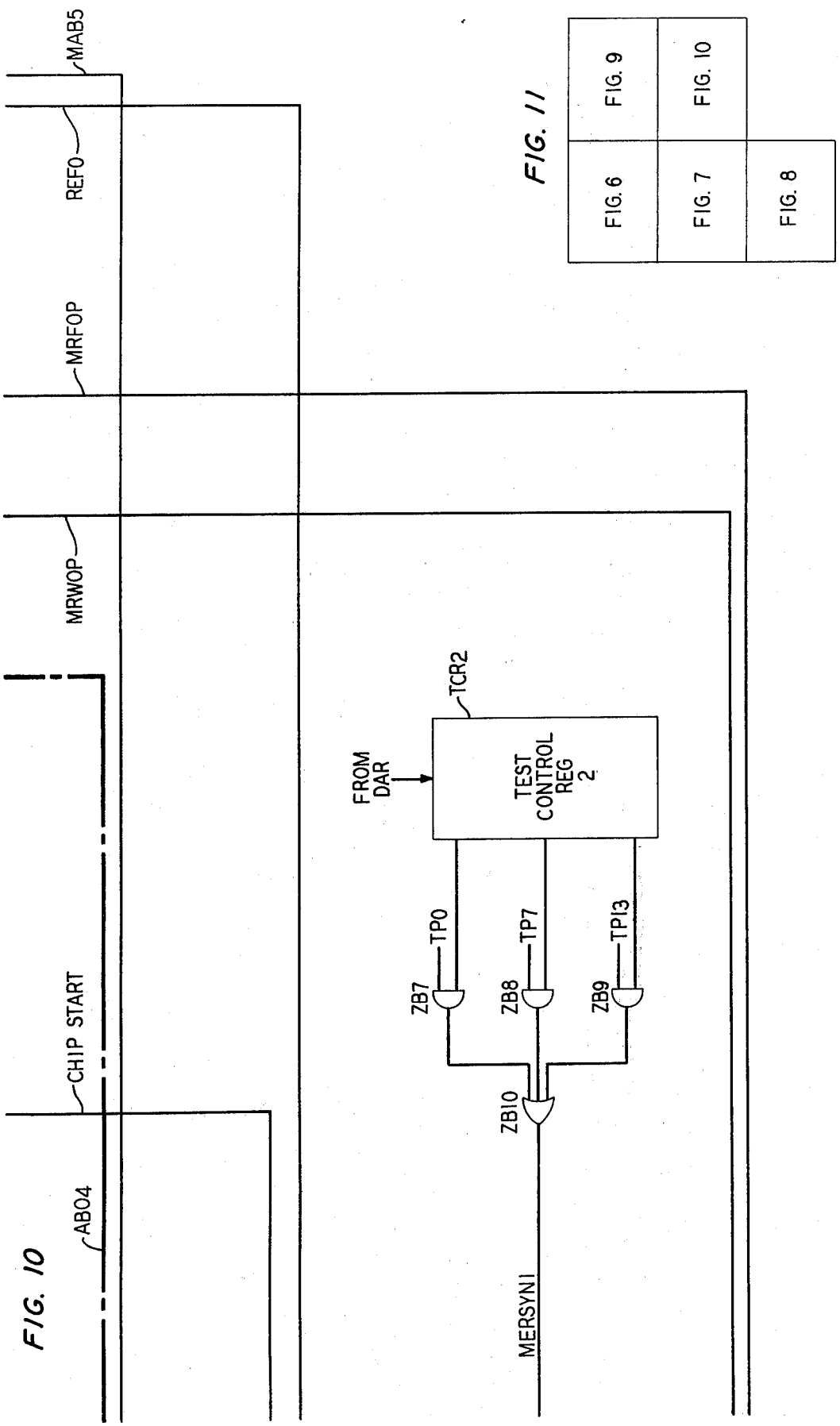

MEMORY DIAGNOSTIC ARRANGEMENT

FIELD OF THE INVENTION

This invention pertains to diagnosing memories and, more specifically, to diagnosing access circuitry utilized to control access to the memory storage elements. Even more specifically, this invention pertains to diagnosing the operability of semiconductor memories during periods of nonaccess, and to diagnosing the diagnostic apparatus itself during memory access operations.

BACKGROUND OF THE INVENTION AND PRIOR ART

In recent years tremendous technological strides have been made in the area of high capacity memory storage. Such strides are best illustrated by semiconductor memory systems utilizing field effect transistors to store information therein in the form of capacitive charges. Such memories have great potential for use in inexpensive large capacity memory systems due to their small size, low power consumption and ease of fabrication as integrated circuits. However, this type of memory suffers from the disadvantage that the capacitive storage of information is essentially volatile and, accordingly, must be periodically restored or refreshed in order to maintain the viability of the stored information. Moreover, because such memories are often formed by combining a plurality of chips into arrays to form a plurality of memory planes, numerous decoders are required to indicate the column and row of the desired chip as well as the column and row of the desired cell within the chip to which access is desired. Because of the complexity of semiconductor memories, the access circuits utilized to control access to the memories are hard to diagnose. However, to ensure the operability of a semiconductor memory system, effective diagnosis must be made of the control circuitry therein to ensure that such control circuitry is applying the proper control signals to the semiconductor memory arrays. Several prior art arrangements as discussed below have been designed to diagnose such memories.

In one prior art arrangement as disclosed in J. A. Weisbecker, U.S. Pat. No. 3,599,146, issued Aug. 19, 1971, each word stored in the semiconductor memory contained a parity bit indicating the parity over the address at which that word was stored. By first computing the actual parity over the outputs from the address register, and then by comparing that computed parity with the parity bit in the retrieved word, it could be ascertained whether the memory had been accessed at the proper address. This arrangement appears to be effective; however, the use of the memory for storage of additional diagnostic information is costly and the arrangement is limited to detecting addressing errors.

In another prior art arrangement disclosed in C. M. Nibby, U.S. Pat. No. 3,814,922, issued June 4, 1974, a maintenance status register and associated apparatus were utilized to identify and store information relating to errors arising in a semiconductor memory module. This arrangement produced error correcting code signals for stored information, which code signals were also stored in the memory module. These stored error correcting code signals were then combined with the information signals to form a group of location identifying signals. This arrangement appears to be effective but like the above-mentioned Weisbecker arrangement, the storage of diagnostic information is costly and, moreover it appears that complicated logic operations are required to detect malfunctions.

In still another prior art diagnostic arrangement, disclosed in F. V. Beck, D. C. Peterson, E. M. Prell, T. Quin, application Ser. No. 601,522, filed Aug. 4, 1975; now, U.S. Pat. No. 3,944,800, a pair of access circuits are provided with each module with each access circuit controlling the accessing of predetermined bits of each word stored in that module. During read, write, and refresh operations, the output signal generated by each of the two access circuits for application to the memory elements in that module are compared (or the parities of such output signals are compared) to ensure the memory elements are being properly accessed, and particularly that both memory halves are being accessed at the same address. This arrangement is very effective in detecting problems associated with the duplicated access circuits during memory access operations; however, it is ineffective to detect problems in nonaccessed modules. It is desirable to detect errors potentionally affecting memory operations as soon as possible, and preferably before erroneous information is given to the data processor. Taking a memory module out of service before it is accessed minimizes diagnostic problems by insuring that the past occurrence of an error condition will eventually be given to the processor. The sensitivity of access circuitry to faults affecting specific addresses makes the retention of observed error conditions crucial.

It is an object of this invention to perform diagnostic operations on nonaccessed memory modules to ensure the continued operability of the access circuits associated therewith.

It is a further object of this invention to perform such diagnostics on a noninterfering basis so that the error-free operation of the access circuits is verified without interfering with normal memory utilization.

It is a further object of this invention to diagnose the diagnostic apparatus itself during normal memory access operations without affecting such operations.

SUMMARY OF THE INVENTION

As disclosed in the above-mentioned Beck et al. application, the access circuitry for each memory module is duplicated so that a pair of access circuits are jointly utilized to access words in a memory module. Thus, for example, if a module stores 48-bit words, one access circuit controls the accessing of predetermined bits of each of the words (e.g., bits 0, 1, 4, 5, 8, 9 ... 44, 45) while the other access circuits controls the accessing of the remaining bits in each word (e.g., bits 2, 3, 6, 7 .. . 46, 47). Thus, for each addressed word, one access circuit accesses half the bits of that word, while concurrently the other access circuit accesses the remaining bits of the word. During a read, write, or refresh operation on one module, the control signals output from each of the access circuits in that one module are compared to ensure that the module is being accessed properly and particularly that the memory "halves" are being accessed at the same address.

In accordance with the principles of this invention, when a memory module is not being accessed, the control leads, which extend from the access circuits to the memory array therein, are "clamped" to predetermined states. This serves to prevent a memory module from being accidentally accessed. Moreover, at appropriate times or timed intervals, such as when one memory module is accessed, the outpus of the access circuits in each of the other nonaccessed modules are verified to ensure that these control leads are in fact in their predetermined states. This verification can be accomplished in many ways such as by comparing the outputs of the duplicated access circuits in each of the nonaccessed memories or by comparing the parities over these outputs or by comparing the actual outputs of an access circuit is a nonaccessed memory module with other information which indicates the expected states of such control signals. Thus, this principle of our invention is also applicable to memory modules accessed by a single access circuit, as hereinafter explained.

Thus, in accordance with a feature of our invention at suitable times or intervals such as when one memory module is accessed, the outputs from the access circuits in each of the other nonaccessed memories are verified.

During a refresh operation the states of some of the address bits applied to the memory arrays are irrelevant since often a group of memory cells, such as a row of cells, is refreshed at the same time. To ascertain whether the above-described diagnostic circuitry is in fact able to detect mismatches between the outputs of the access circuits for a given module, one of these irrelevant address bits can be forced to a different state at the input to one of the duplicated access circuits while leaving the same address bit in its normal state at the input to the other access circuit. This forces a mismatch between the control signals generated by each of the two access circuits. The detection of such a mismatch or the failure to detect the mismatch then indicates the operability of the diagnostic apparatus.

In accordance with still another feature of our invention, at least one of the "don't care" bits during refresh operations is forced in only one access circuit of each module circuit to a different state. This tests the ability of the diagnostic circuitry itself to detect mismatches without in any way interfering with normal refresh operations.

BRIEF DESCRIPTION OF THE DRAWING

The foregoing as well as other objects, features, and advantages of our invention will be more apparent from a description of the drawing in which:

FIG. 1 illustrates the circuit diagram of an IGFET dynamic memory cell;

FIG. 2 illustrates how the IGFET memory cells of FIG. 1 are organized in a matrix to form an IGFET memory chip and also illustrates the various circuitry utilized to access the information stored on the chip;

FIG. 3 illustrates how the IGFET memory chips of FIG. 2 are organized into memory planes;

FIGS. 6–10 when combined as shown in FIG. 11 illustrate the detailed structure in the one illustrative embodiment of our invention generalized in FIG. 4;

More specifically, FIG. 6 illustrates control circuitry and data registers for providing communication between the memory modules and the data processing unit;

FIG. 7 illustrates how the memory planes shown in FIGS. 3 and 4 are organized to form various memory modules and also illustrates the duplicated access circuits utilized to control access to specified bits in the memory modules;

FIG. 8 illustrates the diagnostic circuitry utilized to detect malfunctions during read, write, and refresh operations on the memory modules as well as during periods of nonaccess of the modules;

FIG. 9 illustrates timing circuits and circuitry for controlling the refresh operation on all modules and circuitry for forcing mismatches during refresh to ascertain the operability of the diagnostic circuitry shown in FIG. 8;

FIG. 10 illustrates circuitry for controlling the specific timing points at which "mismatch error signals" can be generated; and FIG. 11 illustrates the manner in which FIGS. 6–10 are to be arranged.

GENERAL DESCRIPTION

Figure 4:
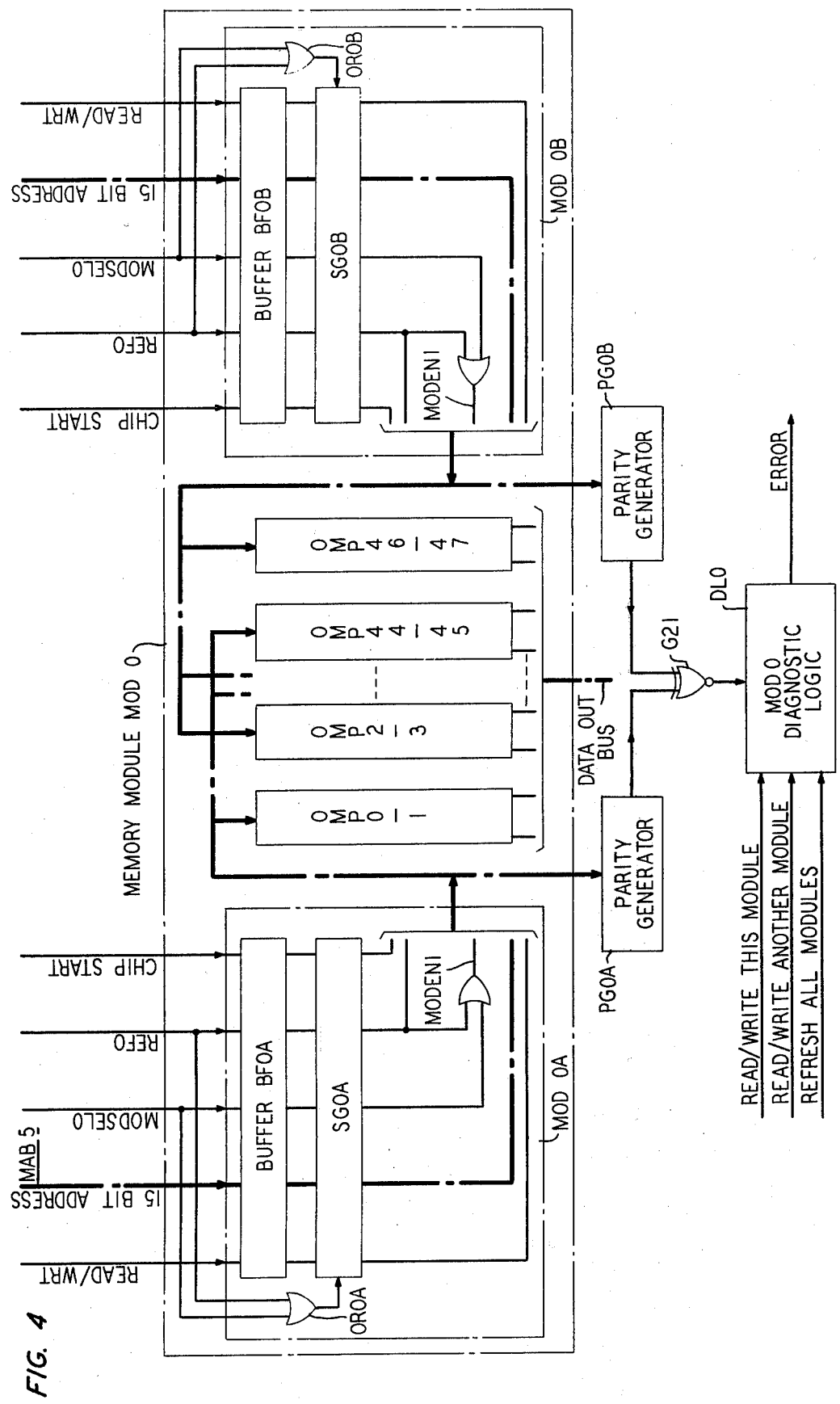
FIG. 4 illustrates in generalized form diagnostic apparatus in accordance with one illustrative embodiment of our invention.

FIG. 1 illustrates the basic IGFET dynamic memory cell DC. Cell DC comprises three field effect transistors designated W, S, and R. Transistor W is associated with writing, transistor R is associated with reading, and transistor S is associated with the storage of the information in the cell. This information is stored in the form of a charge or lack of charge on capacitance C. This capacitance is parasitic on transistor S. To write into the cell, information is placed on access lead DATA1 and transistor W is switched on utilizing the WRITE SELECT input. This charges or discharges capacitance C to a voltage equal to that of the information signal. If capacitance C is charged to a voltage of $-V$, transistor S is switched on, otherwise transistor S is off. The information content of the cell can be read simply by switching on transistor R utilizing the READ SELECT lead and then sensing the impedance of transistor S over lead READ1.

The charge on capacitance C gradually leaks off and unless the cell is rewritten periodically the stored information will be lost. As described more fully hereinafter, each cell is refreshed every 1.92 ms.

In order to facilitate the understanding of the concepts of our invention, the structure of the IGFET memory cell and its organization on chips and finally on memory planes will be described only to the extent necessary to understand our invention. For further reference to the intricacies of the cell and its organization on chips, reference can be made, for example, to J. T. Koo, application Ser. No. 518,636, filed Oct. 29, 1974. The above-described FIG. 1 corresponds to FIG. 2 in the Koo application.

FIG. 2 illustrates how the IGFET cells such as DC are arranged in a 32 × 32 cell matrix to form IGFET chip X. Row selector RW and column selector CS are provided to selectively control the accessing of individual cells during read, write, and refresh operations. More specifically, address bits 0–4 are decoded to select the horizontal cell row, and address bits 5–9 are decoded to select the appropriate column. The manner in which cell DC is accessed for read and write operations will now be briefly described by way of an example of how an individual cell is accessed. For a read operation, read select lead RS1 is lowered to its ON level so that the information stored in the cell appears on lead READ1. This information is inverted by gate 21 and applied through gate 22 to gate 23. Read command lead RC1 then goes HIGH to gate the information onto lead BITOUT. It should be noted that information was read from each of the cells in the first row of the chip when the voltage of lead RS1 was lowered and by selectively enabling the appropriate read command lead RC1–RC32 the information from the desired cell was placed on lead BITOUT.

To write into cell DC, the bit to be stored is placed on lead BITIN and then write command lead WC1 is enabled to energize gate 24 so that the data bit is applied to lead DATA1. Write select lead WS1 is then enabled so that the information on lead DATA1 is stored in capacitance C.

A mentioned previously, each IGFET cell must be periodically refreshed to maintain proper capacitance C for each cell. This is accomplished by refreshing a row of cells at the same time. Thirty-two refresh operations are required to refresh an IGFET chip because each chip has 32 rows of cells. More specifically, to refresh a row of IGFET cells, the corresponding read select lead such as lead RS1 is first lowered to its ON level. The information stored in each cell appears on its respective read lead such as lead READ1 or READ32. The output from each cell is then inverted by its column amplifier such as amplifier CA1 or CA32 and applied to the appropriate data lead such as lead DATA1 or DATA32.

After the complemented output has settled on the data leads DATA1–DATA32, write select lead WS1 is lowered and the data signal voltage on each of the data leads is transferred to the respective capacitances C in each cell in the first row. The select signals are then returned to their idle level. It should be noted that a row is refreshed each time a cell therein is accessed for a read or write operation. Thus, refresh operations for particular rows may not be required if the cells in these rows are being actively interrogated.

The above-described IGFET chip may be, for example, the chip shown on FIGS. 1A and 1B, of the above-mentioned Koo application. The various read, write, and refresh operations are described in greater detail in the Koo application. Other figures therein illustrate the column amplifiers and describe the generation of internal timing signals utilized in accessing the chip.

FIG. 3 illustrates the manner in which the chips shown in FIG. 2 are combined to form a memory plane. More specifically the 1,024-bit chips are organized into an 8 × 8 matrix. The designation X in FIG. 3 indicates the location of IGFET chip X shown in FIG. 2. Of course this chip is identical to each of the other chips in the plane and could have been located anywhere in the matrix. The depicted memory plane stores 32,768 two-bit words. As shown in FIG. 3 one bit is retrieved from the upper half of the memory plane and output through sense amplifier SA1 and the second bit is retrieved from the lower half of the memory plane and output through sense amplifier SA2. Thus, for a normal read or write operation, one chip in the upper half plane will be selected for access thereto and one chip in the lower half plane will be selected for access thereto.

More specifically, address bits 10–12 are decoded by one-out-of-eight decoder DEC18 to select a column, and address bits 13 and 14 are decoded by one-out-of-four decoders DEC14 to select a row. Thus, decoder DEC18 enables one of its output leads V1–V8 to select a column of cells, and decoder DEC14 enables one of its output leads H1–H4 to select a row in each half plane. The cell in each half plane at the intersection of the enabled leads is thereby selected.

As mentioned previously in regard to FIG. 2, address bits 0–9 are decoded to select the cell in each chip to be accessed. Thus in summary, first two chips on a memory plane are selected at the intersection of the enabled vertical and horizontal leads, and then a single cell on each of the two selected chips is selected by utilizing row and column selectors in the manner previously described to apply vertical and horizontal control signals to the selected chips. The information stored in the two selected cells is then output through the respective sense amplifiers, responsive to the HIGH state of lead MODEN1.

Thus, with reference to FIG. 3 decoder DEC18 is responsive to address bits 10–12 for providing an enable signal on one of the vertical leads V1–V8 and decoder DEC14 is responsive to address bits 13 and 14 for applying an enable signal to one of the horizontal leads H1–H4. For example, if leads V1 and H1 are enabled then chip X will be selected for access thereto and chip Y will also be selected. Then, address bits 0–9 select the single cell on chips X and Y which is to be accessed. For a read operation, the desired information from cells X and Y will appear at the outputs designated BIT1 and BIT2 respectively. For a write operation, the data to be stored in the upper memory array is applied to lead DATA1 and the information to be stored in the lower memory array is applied to lead DATA2. The control circuitry is responsive to the state of lead READ/WRT which indicates whether a read or write operation is to be performed, as later discussed.

For a refresh operation, one row on each chip in the memory plane is refreshed at the same time. Thus, for example, the first row in chips X, Y, and each of the other chips will be refreshed at the same time. This refresh operation is performed responsive to the state of lead REFO which will be discussed in greater detail hereinafter, and also responsive to predetermined states of address bits 10–14.

FIG. 4 illustrates how the memory planes shown in FIG. 3 are organized to form a complete memory module (MOD0). In the depicted arrangement, 24 memory planes are organized to store 32,768 48-bit words. Bits 0 and 1 of each word are stored in memory plane OMP0-1 and the last bits in each word, namely, bits 46, and 47 are stored in memory plane OMP46-47. Each of the memory planes is structurally identical to the plane shown in FIG. 3 including all decoders and other illustrated circuits as described above.

In one illustrative embodiment of our invention, the memory access circuitry is duplicated with each of the access circuits MODOA and MODOB controlling the access to specific ones of the memory planes. For example, it is seen that access circuit MODOA controls the access to memory planes OMP0-1, OMP4-5, . . . OMP44-45. Thus, circuit MODOA controls the access to alternate memory planes. Access circuitry MODOB controls the access to the remaining memory planes OMP2-3, OMP2-3, OMP6-7, . . . OMP46-47 in this one memory module.

The same control signals are simultaneously applied to both access circuits, so that each access circuit operates independently but concurrently to access the bits of the data word so that all 48 bits of the word at a specified address are retrieved at the same time and applied in parallel to cable DATAOUT. On the depicted figure it is seen that each of the input leads to the access circuits is duplicated. Thus, as described hereinafter, even though similarly designated leads are in fact independent leads, such leads are connected to a common signal source. For example, both leads designated CHIP START are connected to the ONE output of the same flip-flop as hereinafter explained. These independent leads are provided to facilitate fault detection in the equipment.

Both access circuits are responsive to (1) a read or write indication on lead READ/WRT (2) the 15-bit address of the designated word, (3) a module select signal which appears on lead MODSEL0 which indicates that the word is to be written into or retrieved from this memory module MOD0 rather than from another memory module (such as MOD1-5 as hereinafter described) which is also potentially responsive to the address, (4) a signal on lead REF0 which indicates that a refresh operation is required and (5) a signal on lead CHIP START which is a timing signal utilized to institute access to the module. All these signals will be described more fully hereinafter.

The information indicated by each of the above-mentioned leads and cables is independently buffered in access circuits MOD0A and MOD0B by buffers BF0A and BF0B respectively. This information is then applied from the buffers to the respectively symbolic gates SG0A and SG0B. Symbolic gate SG0A is representative of a plurality of AND gates equal in number to the number of leads extending through buffer BF0A, as indicated in FIG. 4. Each of these plurality of gates is responsive to the output of OR gate OR0A for gating through the information on the lead associated with that gate to the associated group of memory planes. Thus, responsive to a HIGH output from gate OR0A, symbolic gate SG0A applies to memory planes OMP0-1, OMP4-5, . . . OMP44-45 all the buffered control signals, such as READ/WRT, MODSEL0, REF0, CHIP START and each of the 15 address bits specified by cable 15 BIT ADDRESS. OR gate OR0A generates a HIGH output responsive to the HIGH states of either lead MODSEL0 or REF0. Lead MODSEL0 goes HIGH only when memory module MOD0 is accessed for a read or write operation and lead REF0 goes HIGH only during a refresh operation. Thus, during periods of nonaccess for MOD0 leads MODSEL0 and REF0 are both LOW and gate OR0A generates a LOW output inhibiting symbolic gate SG0A from applying any of the buffered information to the associated memory planes. While symbolic gate SG0A is inhibited, all output leads therefrom are clamped to a uniform predetermined LOW state. The above description in regard to gates OR0A and SG0A is equally applicable to gates OR0B and SG0B which perform the identical functions in access circuit MOD0B, and serve to control the application of control signals buffered by buffer BF0B to memory planes OMP2-3, OMP6-7, . . . OMP45-47. It should be noted that lead MODEN1, previously described in regard to FIG. 3, goes HIGH responsive to either the HIGH state of lead MODSEL0 or to the HIGH state of lead REF0 as output by symbolic gates SG0A and SG0B as shown in FIG. 4. As mentioned previously lead MODEN1 serves to control the gating out onto bus DATAOUT of the two bits retrieved from each of the memory planes.

Parity generator circuits PG0A and PG0B are provided to generate a parity indication over the outputs of access circuits MOD0A and MOD0B respectively. These parity indications are applied to EXCLUSIVE NOR gate G21 which continuously compares these parity indicators and generates a LOW output to module zero diagnostic logic DL0 when a mismatch is detected. Responsive to this mismatch, diagnostic logic then provides an error signal on lead ERROR if an indication is present on lead READ/WRITE THIS MODULE indicating that module MOD0 is being read or written at this time. This check serves to ensure that both access circuits are properly accessing the word at the same address.

Thus, for example, if circuit MOD0A is indicating to its memory planes that the bits stored at a particular address are to be read, while circuit MOD0B is indicating to its memory planes that the bits stored at another address are to be read, then generators PG0A and PG0B will generate different parity indications and gate G21 will detect a mismatch and so inform logic DL0 which then provides an error signal.

When memory module MOD0 is not being accessed, then the outputs from each of the access circuits should be clamped to predetermined states so that module MOD0 is not capable of being accessed as discussed above. By verifying this periodically or upon the occurrence of specified events, the apparent operability of MOD0 can be verified. Thus, in accordance with another feature of this invention, when another module is being accessed for a read or write operation, the outputs of access circuits MOD0A and MOD0B are compared by parity generators PG0A and PG0B which should indicate the same parity. If, however, there is any leakage or other malfunctions on one of the access circuits then gate G21 should detect a mismatch between the parity indications and so inform diagnostic logic DL0. Responsive to this mismatch condition, logic DL0 will generate an error signal if another module is being accessed as indicated by lead READ/WRITE another module. Thus, logic DL0 is beneficially adapted to detect malfunctions in memory modules MOD0 even when another memory module is being accessed.

Diagnostic logic DL0 is also responsive to refresh operations for detecting mismatches between the outputs of access circuits MOD0A and MOD0B. During refresh operations, circuits MOD0A and MOD0B should generate identical outputs to refresh the same row in each chip of every memory plane, and accordingly, a mismatch indicates a malfunction which might effect the viability of the stored information.

It should be noted that the parity generators are provided only to facilitate the comparison of outputs from the access circuits and these parity generators could be dispensed with in other embodiments and a straight comparison made of the outputs from the access circuits. However, in this one illustrative embodiment with duplicated access circuits, the comparison of parity signals has proven sufficiently reliable to dispense with a full comparison of output signals.

In accordance with still another feature of this invention, during refresh operations, a mismatch can be forced to check that the diagnostic logic is able to detect discrepancies between the outputs of the access circuits. As mentioned previously, the column select address bits, namely, bits 5-9 are irrelevant during the refresh operation because entire cell rows are refreshed at the same time. However, these bits are still applied to each of the memory planes. Thus, during a refresh operation one of these irrelevant bits can be forced to a different state on one of the two access circuits without interfering with the refresh operation.

Thus, for example, address bit 5 on access circuit MODOA can be forced to a state opposite to its normal control state utilizing lead MAB5 in FIG. 4. By forcing lead MAB5 to a LOW state, bit 5 will appear to be a ZERO to access circuit MODOA, whereas bit 5 will appear to be in its normal ONE state to access circuit MODOB during refresh because lead MAB5 is not connected to circuit MODOB. Accordingly, the parity generators would generate different parity indications over the outputs of the access circuits, and diagnostic logic DLO should then detect a mismatch. If a mismatch is not detected, then this indicates a malfunction in the diagnostic circuitry itself.

As discussed more fully hereinafter, the various input leads to diagnostic logic DLO have been conceptually generalized in regard to FIG. 4 and represent the logical conditions actually indicated by combinations of other control leads.

Figure 5:
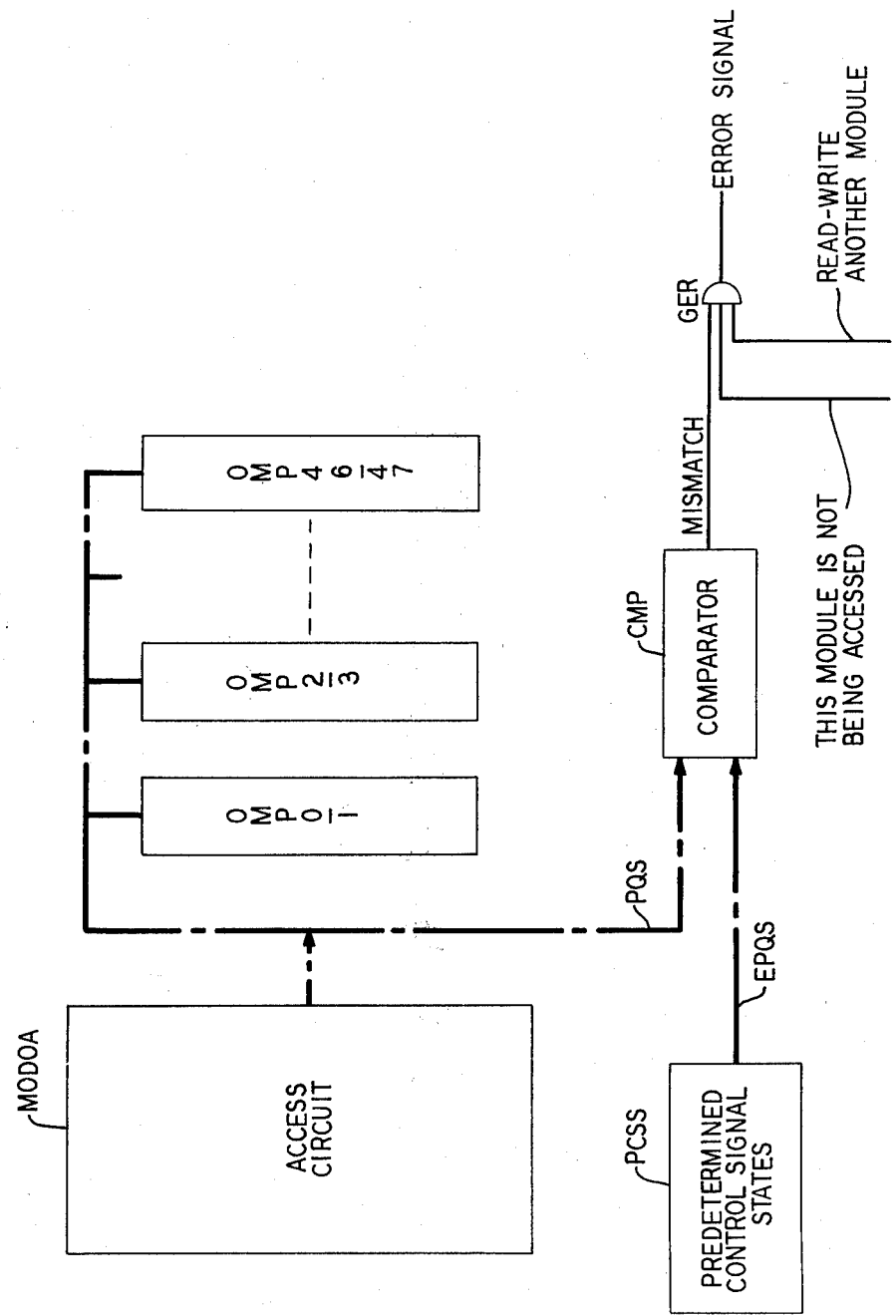
FIG. 5 illustrates in generalized form diagnostic apparatus in accordance with another illustrative embodiment of out invention.

The principles of our invention can also be applied to memories in which groups of modules receive the same control information but only one module is enabled and in which only a single access circuit is provided for each module to control access to all bits in each of its stored words. Thus, with reference to FIG. 5 it is seen that access circuit MODOA controls the access to all memory planes. Circuit MODOA corresponds to its similarily designated counterpart in FIG. 4 but now its outputs are connected to all memory planes in module MODO.

When this module is not being accessed, access circuit MODOA, responsive to clamped input signals, provides output signals which are clamped to predetermined quiescent states. These output leads, in addition to extending to each of the memory planes also extend to comparator CMP which is also responsive to information received from circuit PCSS. This circuit indicates over its parallel outputs the expected quiescent states of the leads in cable PQS (e.g., here the quienscent states should all be LOW). Comparator CMP is a parallel comparator for comparing the information on corresponding leads of cables PQS and EPQS. If there is a mismatch between any of the actual and expected signals, then comparator CMP generates a HIGH output on lead MISMATCH which extends to gate GER. Gate GER only provides an error signal if its other input leads are HIGH indicating (1) that another module is being read or written, and (2) this module is not being accessed.

Thus even when a single access circuit is utilized to control the accessing of a plurality of memory planes, diagnostics can still be effectively performed on a nonaccessed memory module, such as when another memory module is being accessed.

Specific Description

FIGS. 6–10 when arranged as shown in FIG. 11 illustrate the specific circuitry in the one illustrative embodiment of our invention previously generalized in regard to FIG. 4. This circuitry is utilized to access a plurality of memory modules designated MODO—MOD5. Diagnostic circuitry is also described which operates in accordance with logic DLO previously functionally described in regard to FIG. 4. However, now specific timing considerations are described and the interaction of diagnostic logic for each of the modules is also described. The circuitry in FIG. 4 corresponds to its similarly designated counterparts in FIGS. 6–10.

To facilitate an understanding of the operation of this circuitry, we will describe (1) how a read operation and the diagnostics associated therewith are performed, (2) how a refresh operation and associated diagnostic checks are performed, (3) how diagnostic checks are performed on nonaccessed memory modules when another memory module is being accessed and (4) how the diagnostic circuitry itself can be checked by utilizing circuitry to force mismatches of control signals in the duplicated access circuits during refresh operations.

The entire IGFET memory system which is described below operates to store information which is utilized by data processor SPC shown in FIG. 6. This processor comprises duplicated processing units for performing logical and arithmetic operations on data in according with stored program instructions. Processor SPC is comprehensively described in Volume 49 of the *Bell System Technical Journal*, dated December 1970. This *Bell System Technical Journal* describes in some detail the interconnection between the SPC and a memory called a piggy-back twistor memory. The IGFET memory described herein is designed to replace, or in some cases, augment existing piggy-back twistor stores now in service. Thus, each IGFET memory module, which comprises sufficient memory for storing 32,768 words, will operate over existing data and address buses and will communicate with the SPC in a manner substantially identical to that utilized by the old piggy-back twistor memories, which are described on page 2509 et seq. of the above-mentioned *Bell System Technical Journal*.

Figure 6:
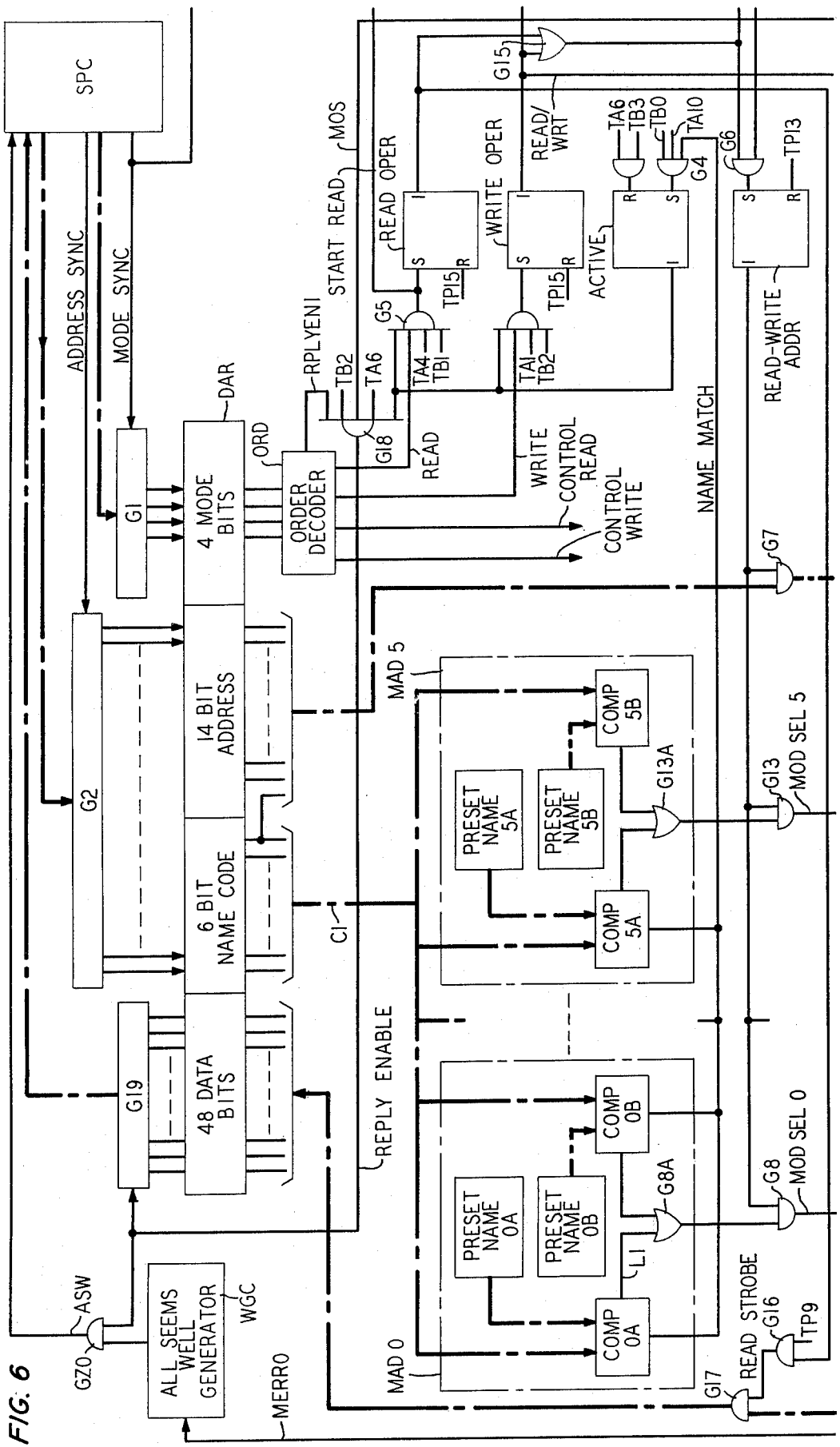

More specifically the SPC provides a high-going pulse on lead MODE SYNC in FIG. 6 to gate the mode bits of an instruction into the data-and-address register DAR in FIG. 6. Thus, lead MODE SYNC enables symbolic gate G1 to gate four MODE bits into register DAR. These MODE bits are applied to order decoder ORD which decodes the bits and generates a HIGH signal on one of its output leads to indicate the type of order to be executed. The different types of orders are read, write, control read, control write, and bus-register test. Read and write operations are used to access memory, the control read and control write operations are used to access control points in the memory system itself, such as test control registers and "out-of-service" flip-flops as described hereinafter, and the bus-register test instructions check the store bus and the data and address register. The SPC also provides an address sync pulse on lead ADDRESS SYNC to enable symbolic gate G2 to gate 20 address bits into register DAR.

The first six bits of the address specify a name code which identifies the particular memory module which is to be accessed and the next 14 bits plus one of the first six bits indicate the address of the word to be accessed within the module. The 6-bit name code is applied over cable C1 to circuits MAD0 through MAD5. Circuits MAD0-MAD5 are module administrative circuits and are respectively associated with modules MOD0-MOD5. Each memory module is identified by two different names. This is done merely for convenience since each of the new IGFET modules takes the place of two of the old piggy-back twistor memories.

Thus with reference to circuit MAD0 and module MOD0, this module is identified by two six-bit names designated 0A and 0B. When the six-bit name code applied over cable C1 matches one of the preset names, one of the comparators COMP0A or COMP0B in circuit MAD0 generates a HIGH signal on lead NAME MATCH thereby indicating that the associated module is to be accessed.

Thus, whenever one of the module administrative circuits detects that its associated module is to be accessed it applies a HIGH signal to common lead NAME MATCH.

Figure 9:
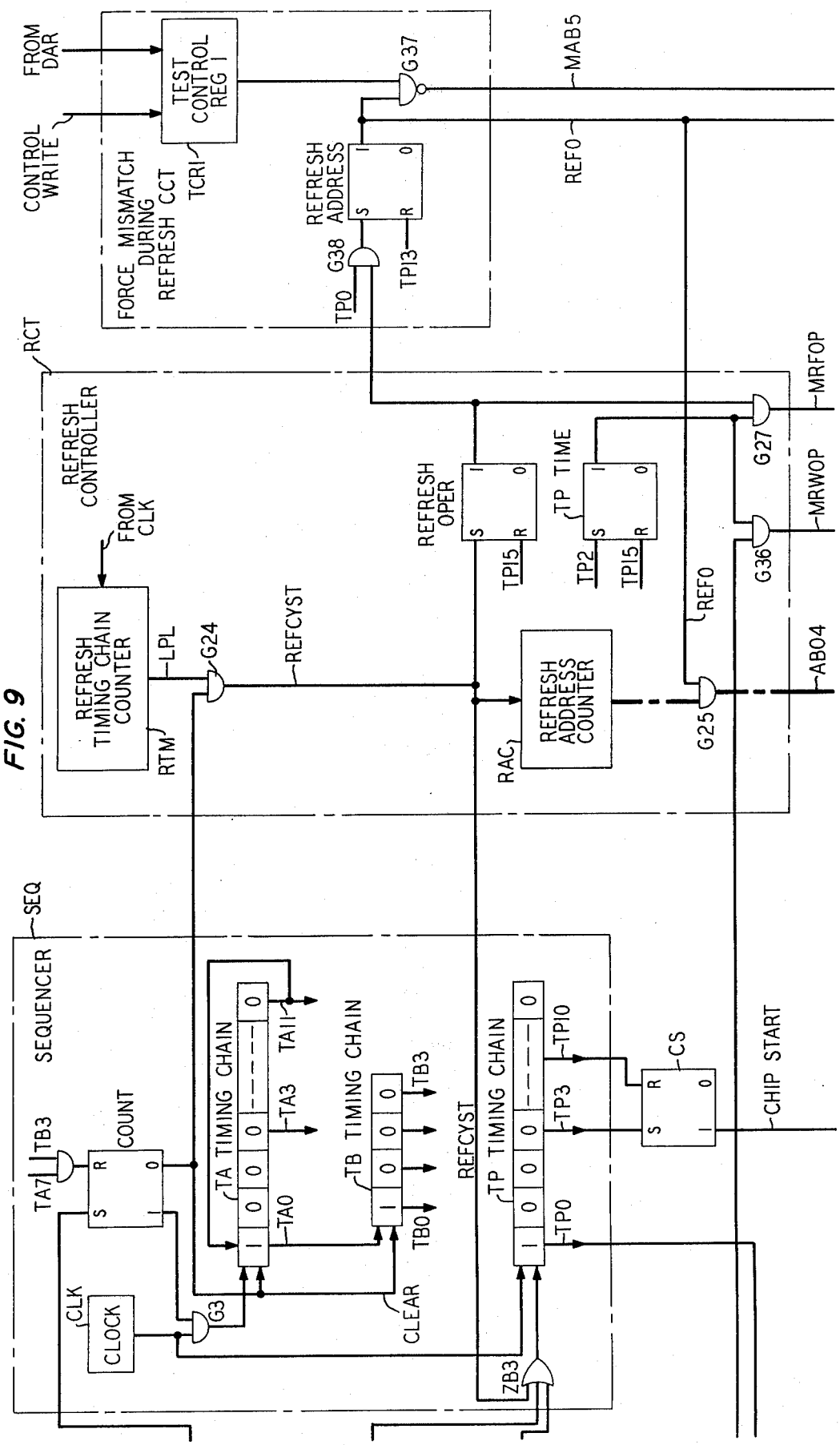

Sequencer SEQ in FIG. 9 contains most of the timing circuitry utilized to control the gating of information in the memory system. More specifically, the MODE SYNC from the SPC also sets flip-flop COUNT and the ONE output of this flip-flop goes HIGH and enables gate G3 to gate the clock signals output from 10 MHz clock CLK to the TA timing chain. This timing chain is actually a shift register with 12 bit positions and is adapted to shift its contents every 100 nanoseconds responsive to the clock signals. It is assumed that a ONE was inserted into the first bit position on the the first clock pulse by well known circuitry not shown and that each of the other positions contained zeros.

For each clock pulse, the ONE is shifted into the succeeding bit position and the output lead associated therewith is enabled. Thus, for example, on the first clock pulse lead TA0 goes HIGH and then on the second clock pulse lead TA1 goes HIGH and so on until the single ONE is shifted into the last bit position and lead TA11 goes HIGH. Then on the next clock pulse, the ONE is recirculated back into the first bit position and the shifting continues.

A second timing chain called the TB timing chain is also provided and this chain shifts every 1.2 $\mu s$ to provide a coarser time resolution than the TA timing chain. A ONE is inserted in the first stage of the register whenever lead TA0 goes HIGH. More specifically, the TB timing chain comprises a four-stage shift register which shifts each time lead TA0 goes HIGH. When the single ONE in this timing chain reaches the last-bit position (i.e., the position associated with output TB3), lead TB3 remains HIGH until time TA7 annd TB3 when the count flip-flop is cleared, which in turn sets the TA and TB timing chains to all zeros.

a. Read Operation

Returning now to the description of the read operation, at the time interval indicated by TB0 and TA10, gate G4 in FIG. 6 responsive to the HIGH state of lead NAME MATCH, generates a HIGH signal to set flip-flop ACTIVE. The ONE output of this flip-flop goes HIGH and applies a HIGH input to gate G5. This gate is also responsive to the HIGH states of lead READ from order decoder ORD and timing leads TA4 and TB1 for generating a HIGH output signal on lead START READ during the interval identified as TA4 and TB1. This signal sets flip-flop READ OPER. The START READ signal from gate G5 is also applied to the TP timing chain shown in FIG. 7 through OR gate ZB3. This timing chain is actually a 16-bit shift register which shifts its contents every 100 ns. Its operation is essentially identical to that described above in regard to the TB timing chains except it shifts responsive to clock CLK and clears itself by shifting the one out of its last bit position. Gate G6, responsive to the set state of the read operation flip-flop (READ OPER) applied as the output of gate G15 and to a HIGH signal on timing lead TP0 at time TP0, generates a HIGH signal to set flip-flop READ-WRITE ADDR. The ONE output of this flip-flop goes HIGH to enable gate G7 in FIG. 6 to gate the 15-bit address from register DAR to each of the memory modules MOD0 through MOD5 and, more specifically, to the left and right access circuits in each module. Gate G7 is symbolic of 30 identical gates, two for each address lead. Thus, one lead for each bit extends to the left side access circuits in each module while a separate lead for each bit extends to the right side access circuits in each module. Similarly, all leads connected to the module access circuits are duplicated. To simplify the drawing this lead duplication is not shown. The HIGH output of the READ-WRITE ADDR flip-flop is also applied to gated G8 through G13, which are respectively responsive to the outputs from circuits MAD0 through MAD5. If either of the comparison circuits in a module administration circuit had detected a name mathc, as described above, in addition to applying a HIGH signal to lead NAME MATCH, it would also apply a HIGH signal through a match gate such as G8A-G13A.

Figure 7:
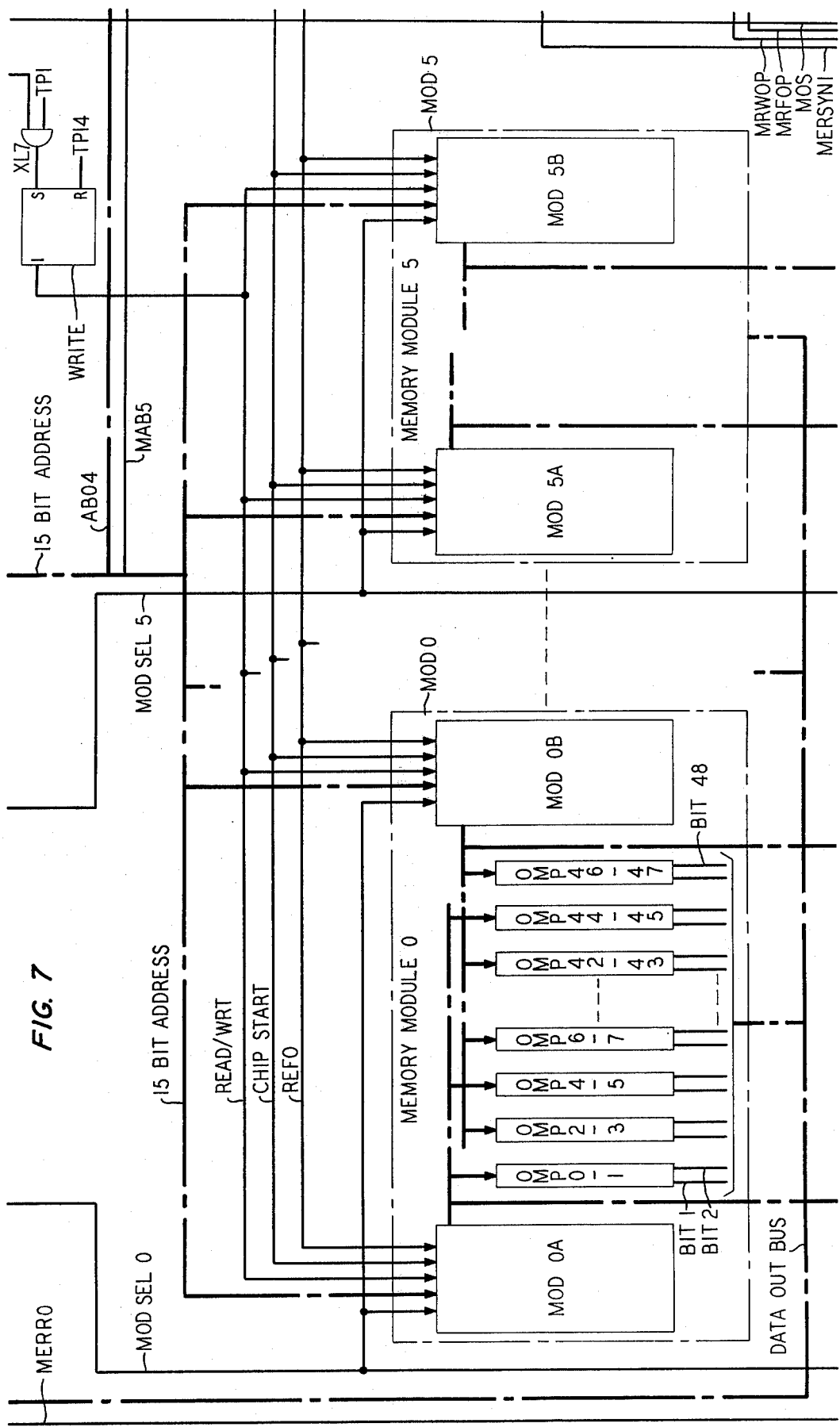

Thus, for example, if comparator COMP0A in circuit MAD0 detected a name match, it would apply a HIGH signal to lead L1 and through OR gate G8A to gate G8. Gate G8 would then generate a HIGH signal on lead MODSEL0 to indicate that the word at the 15-bit address was to be retrieved from module MOD0 and not from any of the other modules MOD1-MOD5. If circuit MAD5 had detected a name match, then gate G13 would have provided a HIGH signal on lead MODSEL5 to indicate to memory module MOD5 that it was to be accessed. Thus even though the 15-bit address is applied to all memory modules, only the module having an enabled MODSEL lead is responsive to the address. At time TP3, lead TP3 is HIGH and sets flip-flop CS in FIG. 9. This flip-flop then generates a HIGH output on lead CHIP START, which lead extends to each of the memory modules and is utilized to indicate that access to a word in the memory can then be commenced. At TP10 flip-flop CS is reset and lead chip start goes LOW. In its idle start, the write operation flip-flop WRITE OPER in FIG. 7 is reset; and it is set only when a write order is to be executed. Since we are dealing with a read instruction now, the ONE output of this flip-flop is LOW and, accordingly, AND gate XL7 cannot set flip-flop WRITE. Lead READ/WRT, the ONE output of flip-flop WRITE, applies a LOW input to each of the memory modules indicating that a read operation is to be performed.

Assuming that a read operation is specified and lead MODSEL0 went HIGH to indicate module MOD0 was to be accessed, all the various input signals to module MOD0, and the 15 bit address are buffered in access circuits MOD0A and MOD0B. These circuits are identical to the similarly designated circuits previously described in regard to FIG. 4.

Thus, with reference to FIG. 7, it is seen that identical control and address information are applied to the left and right access circuits of module MOD0. Accordingly, both access circuits should operate simultaneously to access the 48-bit word stored at the 15-bit address specified. Here the left access circuit MODOA controls the accessing of bits 0 and 1, 4 and 5, 8 and 9 . . . , 40 and 41, and 44 and 45. The remaining bits, namely 2 and 3, 6 and 7, . . . and 46 and 47, are accessed by the right-hand access circuit MOD0B.

Thus, all 48 bits in the specified word module MOD0 are applied to bus DATAOUTBUS which is common to all the memory modules. As mentioned previously, the sense amplifiers, such as SA1 and SA2 in FIG. 3 are controlled by a lead such as MODEN1 to selectively apply information to the DATAOUTBUS from one module at a time.

Then, at TP9, gate G16 in FIG. 6 is enabled responsive to the HIGH state of lead TP9 and to the set state of the read operation flip-flop READ OPER. Thus gate G16 generates a HIGH signal on lead READ STROBE to enable symbolic gate G17 to gate the 48-bit word into register DAR. Then at time TA6 and TB2, gate G18 in FIG. 6 responsive (1) to the HIGH signal on leads TA6 and TB2; (2) to the set state of the active flip-flop ACTIVE; (3) to the HIGH state of lead RPLYEN1 from order decoder ORD (signifying that the current operation should generate a reply); and (4) to the HIGH state of lead MOS which indicates that the selected module is in service-as hereinafter explained; generates a HIGH signal on lead REPLY ENABLE. Symbolic gate G19 is responsive to this reply enable signal to gate the data back to the SPC. This reply enable signal also is utilized to gate an ALL SEEMS WELL signal back to the SPC over lead ASW. This ALL SEEMS WELL signal is generated only if the read operation passed certain diagnostic tests, as described below.

As mentioned previously, two parity generators are associated with each memory module for respectively indicating the parity over the outputs from the left and right access circuits in the associated module.

Thus, for example, parity generator PG0A is responsive to the output from circuit MOD0A for generating on lead P0A the parity over this output. Similarly, parity generator PG0B generates a parity indication on lead P0B responsive to the outputs from circuit MOD0B. These parity indications are compared by EXCLUSIVE NOR gate G21 which provides a LOW indication for any detected mismatches. This LOW indication can be gated into flip-flop MISMATCH0 at three times intervals namely TP0, TP7, and TP13.

More specifically, certain bits in test control register TCR2 in FIG. 10 are utilized to control which if any of the three timing pulses are utilized to perform a check. To elaborate, gates ZB7–ZB9 are respectively responsive to the signals on leads TP0, TP7 and TP13; and to three bits in register TCR2, to generate outputs which are applied to OR gate ZB10. For example, if these bits are all HIGH than checks are performed at each of the three timing intervals. Gate ZB10 generates an output on lead MERSYN1 which extends to flip-flops MISMATCH0-MOSMATCH5, to gate into these flip-flops any detected mismatches. Bits in registers TCR2 and TCR1 are administered via control write operations. Normally, TCR2 is configured to allow gating of mismatches at times TP0, TP7, and TP13.

The presence of mismatch indications is monitored at three distinct timing points to ensure the continued operation of the access circuits throughout the access operation. More specifically, at TP0, a check is instituted to ensure that the outputs of the access circuits are clamped to their predetermined states prior to access. By TP7, all control signals should have been generated and applied by the access circuits to the memory module. Thus, the check at TP7 is to ensure that the module is being properly accessed. Finally, at TP13 all control signals are present except the chip start signal. Thus, the third check is made toward the end of an access to allow examination of the turn off of the timing signals. Thus, in accordance with an aspect of our invention, the presence of mismatches is checked at various predetermined time intervals prior to and during the access operation.

If a mismatch is detected at any one of these time instances, the output of flip-flop MISMATCH0 designated Q will go HIGH to provide a HIGH input to gate G22. This gate is also responsive to a module active signal from gate G23 indicating that module MOD0 is active (lead MODSEL0 is HIGH) and is in-service (flip-flop OS0 is reset). Thus, if the error is detected in a read or write operation in which module MOD0 is in-service, then gate G22 generates a HIGH output signal on lead MERR0. This lead extends to ALL SEEMS WELL generator circuit WGC in FIG. 6 and responsive to the HIGH signal on lead MERR0, circuit WGC inhibits the generation of an ALL SEEMS WELL signal so that when the word read from memory is returned to the SPC as previously described, an ALL SEEMS WELL signal will not be provided. This indicates to the SPC that a problem has been detected in the memory and that the word just read from memory should not be used because it may contain errors.

The preceding has described how the depicted circuitry is controlled to perform a read operation and how diagnostic comparisons are instituted between the outputs of the access circuits in the accessed module to verify the integrity of the read operation. During a write operation, identical comparisons are instituted between the outputs of the access circuits in the accessed modules in a manner so substantially identical to that described above that further discussion of write operation beyond previous discussion of the write operation in regard to FIG. 2 is not deemed necessary.

b. Refresh Operation and Diagnostics Associated Therewith

In this dynamic storage medium because of the volatile nature of the stored information, all stored information must be periodically refreshed. In this illustrative embodiment, every 60 $\mu$s one row in each chip is refreshed, as described previously. Thus, 32 cycles are required to refresh the entire memory and all six memory modules MOD0–MOD5 are refreshed simultaneously.

The refresh operation is utilized as a diagnostic tool to verify that the access circuits associated with each memory module are operating correctly. More specifically, for each refresh operation, a parity comparison is made between the control signals output from the right and left access circuits for each module. Thus, even in the absence of a read or write access to a memory module, the operability of the access circuits therein are still diagnosed at relatively frequent time intervals.

FIG. 9 illustrates refresh controller RCT which generates the various timing and control signals to control the performance of the periodic refresh operations. More specifically, refresh timing counter RTM is provided for generating a HIGH pulse on lead LPL every 60 $\mu$s. Responsive to this HIGH signal if the count flip-flop COUNT in FIG. 9 is reset, gate G24 generates a HIGH output signal on lead REFCYST to indicate the start of a refresh cycle.

As mentioned previously, the count flip-flop COUNT is set when either a read or write access is being instituted in one of the memory modules. Thus if the count flip-flop is set, the refresh operation is temporarily delayed to avoid interference with the read or write operation. Adequate time is reserved between memory access to perform one refresh operation. The circuitry for avoiding these conflicts is well known and is not described any further herein. However, for further reference to arrangements for avoiding these conflicts J. A. Reed U.S. Pat. No. 3,858,185, issued DEC. 31, 1974, and S. B. Behman Pat. No. 3,810,129, issued May 7, 1974, may be consulted.

The HIGH output from gate G24 on lead REFCYST is also applied to refresh address counter RAC to increment the present count therein. Counter RAC is a binary counter for counting from 0–31 to indicate the particular row of cells in each chip which is to be refreshed. Thus, at 60 µs intervals successive rows of cells are refreshed with the identity of the row to be refreshed being indicated by counter RAC. The HIGH state of lead REFCYST is also applied to the TP timing chain in FIG. 6 through gate ZB3 to restart the chain to institute the timing necessary for a refresh memory access. The use of this chain was previously described in regard to a read operation. The HIGH signal on lead REFCYST also sets flip-flop REFRESH OPER which in turn allows flip-flop REFRESH ADDRESS to be set at time TP0 by gate G38. The ONE output of this flip-flop is designed REF0 which extends to all memory modules and when HIGH indicates a refresh operation is to be performed. Gate G25 is enabled by the HIGH state of lead REF0 to apply the row count indicated by counter RAC over cable AB04 to the 15 bit address cable and then to each of the access circuits MOD A and MOD B in each of the memory modules MOD-0–MOD5. The output of counter RAC now indicates address bits 0–4 to the modules and serves to select the row of cells which is to be refreshed in every chip therein.

The refresh operation is instituted in a manner substantially identical to that described previously in regard to FIGS. 2 and 3 except that cells in each chip in the entire memory are refreshed concurrently. Each of the parity generator circuits such as PG0A, PG0B, ... PG5A and PG5B generates a parity bit over their respective output leads based upon the control signals applied thereto from the associated access circuits. In a manner identical to that previously described in regard to a read operation, gate G21 in FIG. 8 and corresponding gates such as G26 in each of the other modules generate a LOW output if a mismatch is detected between the two parity indications applied thereto. This serves to reset the respective mismatch flip-flops associated with each module if a mismatch is detected, as described below.

For example, if during a refresh operation, access circuits MOD5A and MOD5B erroneously generate different access signals for memory module MOD5, then parity generators PG5A and PG5B should apply different parity indications to gate G26. Then, at the various time intervals such as TP0, TP7, and TP13 as indicated over lead MERSYN1, the LOW output from gate G26 is stored in flip-flop MISMATCH5.

The HIGH output from gate G24 in FIG. 9 on lead REFCYST also serves to set the refresh operation flip-flop REFRESH OPER, as described above, which applies a HIGH output to gate G27 in FIG. 9. This gate is also responsive to the ONE output of flip-flop TP TIME in FIG. 9. This flip-flop is set at TP2 and reset at TP15. Thus, during this time interval the ONE output of this flip-flop is HIGH, applying a HIGH input signal to gate G27. Thus, gate G27 generates a HIGH output signal on lead MRFOP from time TP2 to TP15 during refresh operations. Lead MRFOP extends to the diagnostic circuitry in FIG. 8 for each of the memory modules and more specifically to gates G280 through G285 therein.

These gates are also responsive to the $\bar{Q}$ output from their respective mismatch flip-flops. Thus, for example, if flip-flop MISMATCH5 was reset at TP7 indicating the detection of a mismatch, then its $\bar{Q}$ output would apply a HIGH input to gate G285 which would then generate a HIGH output on lead REFRESH ERROR. This signal indicates that an error has been detected in the access circuits during a refresh operation.

The HIGH state of lead REFRESH ERROR passes through OR gate G29 to gate Z445. If MOD5 is in-service then the ONE output of flip-flop OS5 will be LOW and, accordingly, gate Z445 will generate a LOW output and not set flip-flop IGORE5. However, the HIGH state of lead REFRESH ERROR and the reset state of flip-flop OGORE5 enables gate Z335 to generate a HIGH output to set flip-flop OS5 thereby taking MOD5 out of service. Flip-flop OS5 therefore can indicate that an error had been detected during a refresh operation by setting the module out of service. The ONE output of OS5 and the ONE state of REFRESH ERROR will then set IGORE5. When a particular module is taken out-of-service new information can be written into the module but the module cannot be read in the normal manner. To elaborate, NAND gate OS55 generates a LOW output on lead MOS responsive to the HIGH state of lead MODSEL5 and the HIGH state of the one output of flip-flop OS5. Thus, when a selected module is out of service, lead MOS goes LOW to inhibit gate G18 in FIG. 6 from allowing a response the next time module MOD5 is accessed for a read or write operation. Similar circuitry in each other module controls the state of lead MOS in a manner identical to that described above. A control write operation can be utilized to set or reset the module out of service OS and IGORE flip-flops.

c. Diagnosing One Module When Another Module is Accessed

In accordance with another aspect of our invention, diagnostics are automatically performed on each of the nonaccessed modules when another module is accessed for a read or write operation. For example, during the time interval in which memory module MOD5 is accessed for a read or write operation, diagnostics are still performed on nonaccessed memory modules MOD-0–MOD4. In the absence of the MODSEL signal associated with a given module, both access circuits for that module generate output signals to their memory planes, which signals should be clamped to predetermined idle states, as described previously. Thus, for example, the outputs from access circuits MOD0A and MOD0B are clamped to predetermined idle states, during the access of module MOD5.

Even when a module has not been accessed, its associated parity generators still compute parity over the outputs of the modules' access circuits. These parity indications are still compared by corresponding EXCLUSIVE NOR gates such as G21. Thus, the various mismatch flip-flops are set in the manner described above to indicate the detection of mismatches.

Figure 8:
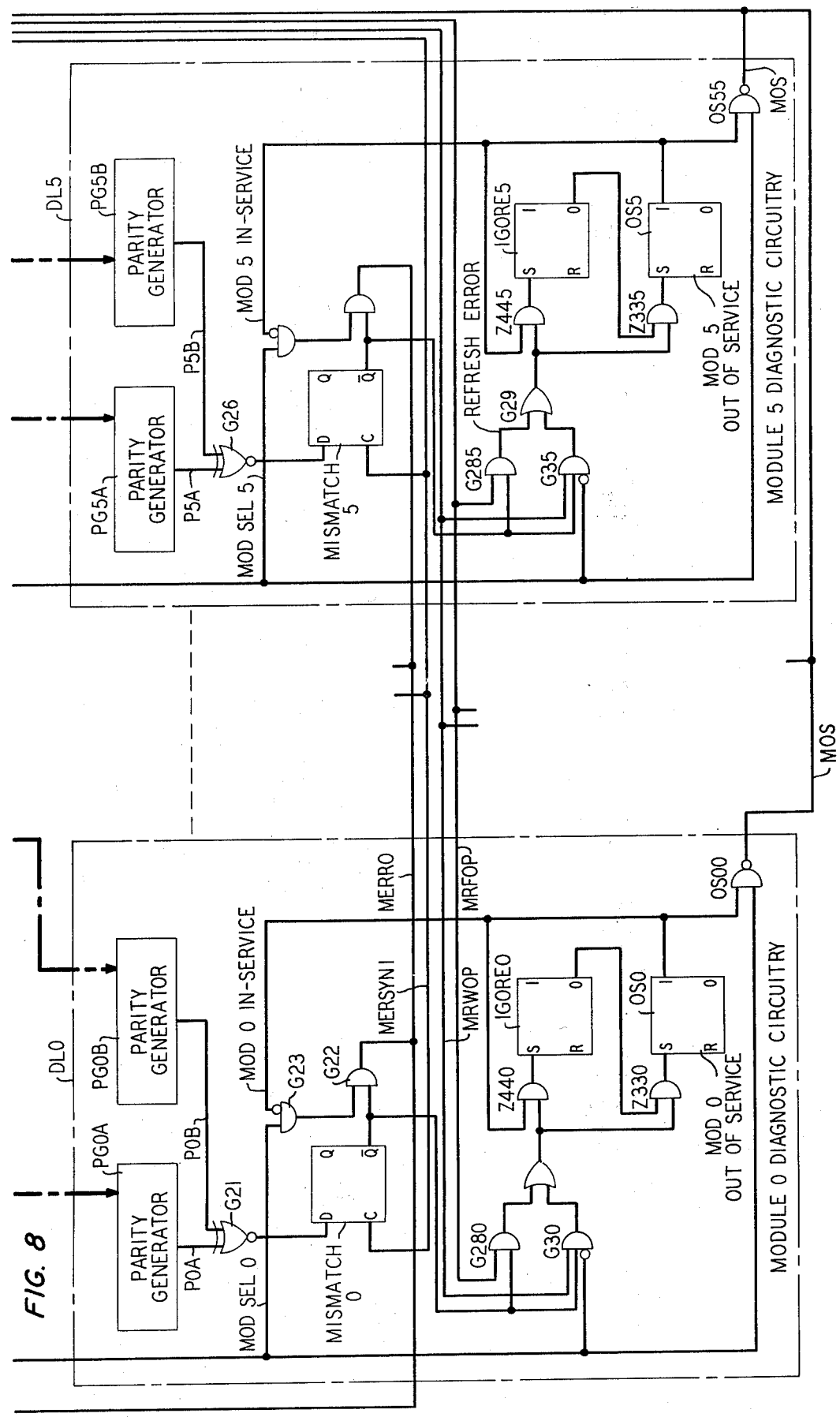

More specifically, gates G30–G35 in FIG. 8 are responsive to the $\bar{Q}$ outputs from the respective mismatch flip-flops and generate a HIGH output to indicate the detection of an error while another module is being accessed. For example, gate G30 generates a HIGH output when (1) the $\overline{Q}$ output from flip-flop MISMATCH0 is HIGH; (2) when lead MRWOP is HIGH as described below; and (3) when lead MODSEL0 is LOW indicating that module MOD0 is not being accessed because a name match has not been detected, as previously described.

An indication that a module is being accessed is provided by OR gate G15 in FIG. 6 which generates a HIGH output responsive to the set states of either the read operation flip-flop READ OPER or the write operation flip-flop WRITE OPER. For this example we will assume that a read operation is being performed on module MOD5 and, accordingly, the ONE output of the read operation flip-flop is HIGH. Thus gate G15 generates a HIGH output which is applied to gate G36 in FIG. 9. Gate G36 is responsive to the HIGH output from gate G15 only during the time period TP2–TP15 because the other input to gate G36 is connected to the ONE output of the TP TIME flip-flop. Thus, during this time interval, gate G36 generates a HIGH signal on lead MRWOP indicating that a module is being accessed. Assuming that there is a parity mismatch for module MOD0 is discussed previously, gate G30 generates a HIGH output which serves either (1) to set flip-flop IGORE0 if flip-flop OS0 is set indicating MOD0 is out of service and OGORE0 is initially reset or (2) to set flip-flop OS0 to take MOD0 out of service and to set flip-flop IGORE0 if flip-flop IGORE0 is initially reset, in the manner previously described or (3) effects neither IGORE0 or OS0 if OGORE0 is initially set.

Thus, even when a module is completely idle, diagnostics are still beneficially performed on the access circuits associated therewith to help ensure the continued successful operation of the module.

After a module's out of service flip-flop is set, when the associated module is later accessed for a read or write operation, lead MOS goes LOW inhibiting the entire memory from responding to the SPC, as previously described.

d. Forcing Mismatch During Refresh

In accordance with another aspect of our invention, the operability of the previously described diagnostic circuitry can itself be diagnosed during refresh operations without interfering with the actual refreshing of information in the memory modules.

Turning to FIG. 9, a test control register TCR1 is provided for use with memory diagnostics. For certain control write commands, information from register DAR in FIG. 6 is written into register TCR1.

When lead REFCYST in FIG. 9 goes HIGH to indicate the start of a new refresh cycle, at TP0, gate G38 in FIG. 9 provides a HIGH output to set flip-flop REFRESH ADDRESS. The ONE output of this flip-flop then goes HIGH, and accordingly, NAND gate G37 provides a LOW output on lead MAB5 assuming the stored bit in register TCR1 was a ONE. This lead extends through cable 15 BIT ADDRESS to the left-side access circuits of each module such as MOD0A and MOD5A to control the state of bit five in the left-side access circuits. However, lead MAB5 does not extend to the right side access circuits and the normal state of bit five as indicated in register DAR is applied to the right side access circuits. As mentioned previously, cable 15 BIT ADDRESS contains duplicated leads to the right and left access circuits. The state of lead MAB5 is chosen so that the left side access circuits will indicat a different address bit five than is indicated by the right side access circuits.

Accordingly each of the left side parity generator circuits such as PG0A and PG5A should generate different parity indications than their right side counterparts. Therefore, each of the mismatch flip-flops MISMATCH0–MISMATCH5 should be reset and, in the manner previously described, gates G280 through G285 should generate HIGH outputs to set flip-flops IGORE0 through IGORE5. However, only one module should be tested at a time. Consequently, before the mismatch is forced via lead MAB5 to test module MOD5, flip-flops IGORE0 through OGORE4 are set by control write operations. When the mismatch occurs, the zero outputs of flip-flop IGORE0 through IGORE4 are LOW, holding the outputs of gates Z330 to Z334 LOW, preventing the REFRESH ERROR indication on the outputs of gates G280 to G284 from setting MOD OUT OF SERVICE flip-flops OS0 to OS4. However, gate Z335 associated with module MOD5 will go HOGH since flip-flop OGORE5 is reset, resulting in flip-flop OS5 becoming set. The HIGH signal on the output of G29 will then, in combination with the HIGH state of the ONE side of flip-flop OS5, cause gate Z445 to go high, setting OGORE5. A control write operation can return MOD5 to service by resetting flip-flop OS5 allowing a later control read operation to determine if IGORE5 became set by the occurrence of the MAB5 signal.

As mentioned previously, during refresh operations address bits 5–9, which normally indicate a single column on each chip, are irrelevant since an entire row of cells are refreshed at the same time. Thus, even though address bit five was forced to an erroneous state in half the access circuits, this does not in any way affect normal refresh operations.

Thus, the SPC after instituting the test of diagnostic circuitry via the control write instruction can then utilize the control read instruction in the normal manner to interrogate the various IGORE flip-flops and MODULE OUT OF SERVICE flip-flops OS0–OS5 to check that the diagnostic circuitry was able to detect mismatches.

What is claimed is:

1. For use with a memory system having an addressable memory module, means for providing an enable signal when said module is to be accessed, access means controlled by said enable signal for applying control signals including an address indication to leads extending to said module to control the accessing of information stored therein and in the absence of said enable signal for causing said leads to assume predetermined states; diagnostic apparatus comprising
means connectable to said leads for detecting the states thereof and for providing a first indication if said leads are not in said predetermined states, and
means jointly responsive to said first indication and to the absence of said enable signal for providing an error signal thereby indicating a potential malfunction in said memory system.

2. The apparatus of claim 1 wherein said detecting and providing means comprises a source of information specifying the expected states of said leads, and a comparator for comparing said expected state information with the actual states of said leads.

3. For use with a memory system having first and second addressable memory modules; means for providing an address; means for providing a first enable signal when said first module is to be accessed and for providing a second enable signal when said second module is to be accessed; first access means controlled by said first enable signal for applying control signals including said address to leads extending to said first module to control the accessing of information stored therein, and for causing said leads extending to said first module to assume predetermined states in the absence of said first enable signal; and second access means controlled by said second enable signal for applying control signals including said address to leads extending to said second module to control the accessing of information stored therein; diagnostic apparatus comprising means connectable to said leads extending to said first module for detecting the states thereof and for providing an error indication if said leads are not in said predetermined states, and means jointly responsive to said error indication, to said second enable signal, and to the absence of said first enable signal for providing a malfunction signal thereby indicating a potential malfunction associated with said first access means and said first module while said second module is being accessed.

4. In a memory system having a plurality of memory modules, at least one of said modules being accessed, and at least another one of said modules not presently being accessed, one of said modules not presently being accessed including access means for causing control leads extending to memory elements therein to assume predetermined states; diagnostic apparatus for use in said memory system and capable of detecting a malfunction in said one module which is not presently being accessed comprising means for detecting the states of said control leads and for providing a first indication if said control leads are not in said predetermined states, and means jointly responsive to said first indication and to the accessing of said at least one module for providing an error indication to indicate a malfunction in said one module which is not presently being accessed.

5. For use in an arrangement comprising an addressable memory including a plurality of volatile storage elements requiring periodic refreshing to maintain the viability of the information stored therein;

control means for providing control information including an address identifying a group of said storage elements which are to be refreshed and including one irrelevant address bit;

first access means responsive to said control information for generating and applying a first set of signals including said address to said memory to refresh the information stored in predetermined ones of said storage elements in said group, second access means concurrently responsive to said control information for generating and applying a second set of signals including said address to said memory to refresh the information stored in the remaining ones of said storage elements in said group;

first parity generating means for computing parity over said first set of signals;

second parity generating means for computing parity over said second set of signals, and comparing said generating means for comparing said parities computed by said first and second parity generating means and for generating a mismatch signal when said parities do not match; a diagnostic apparatus comprising means for forcing said control means to cause said one irrelevant address bit to be in different states for said first and second access means to induct the generation of said mismatch signal, and means for storing said mismatch signal if generated by said comparing and generating means.

6. The arrangement in accordance with claim 5 wherein each of said storage elements comprises a plurality of semiconductor devices, said storage elements are arranged in a matrix with rows and columns, and said storage elements in said group includes all said storage elements in a particular row of said matrix.

7. In an information system comprising a first and second memory, a diagnostic arrangement for checking the apparent operability of said first memory during periods of nonaccess comprising a source of control information for said first and second memories, means for providing a nonaccess indication specifying that said first memory is not being accessed, first access means responsive to said control information in the absence of said nonaccess indication for generating and applying a first set of signals to said first memory to control accessing of a predetermined portion of said first memory, and responsive to the presence of said nonaccess indication for causing said first set of signals to assume predetermined states, second access means responsive to said control information in the absence of said nonaccess indication for generating and applying a second set of signals to said second memory to control accessing of the remaining portion of said first memory, and responsive to the presence of said nonaccess indication for causing said second set of signals to assume said predetermined states, first parity means for computing parity over said first set of signals, second parity means for computing parity over said second set of signals, means for comparing said parities computed by said first and second parity means and for providing a mismatch indication for said first memory if said parities do not match, means for providing an access signal indicating that said second memory is being accessed, and first memory error signal generating means jointly responsive to said access signal, to said nonaccess indication and to said mismatch indication for generating an error signal for said first memory.

8. The arrangement of claim 7 further comprising means responsive to said error signal for inhibiting the transfer from said information system of information subsequently read from said first memory.

9. The arrangement of claim 7 wherein said first memory comprises a plurality of memory planes; wherein said first set of signals are adapted to control the accessing of predetermined ones of said planes and said second set of signals are adapted to control the accessing of the remaining ones of said planes; and wherein said first and second access means each comprise buffer means and logic means for respectively generating said first and second sets of signals by performing logical operations on said control information and on said nonaccess indication.

10. The arrangement of claim 9 wherein said control information includes an address, a read indication, a write indication, a refresh indication, and a start access indication.

11. The arrangement of claim 7 further comprising timing means for providing timing signals at predetermined points in the accessing of said second memory, and wherein said first memory error signal generating means is also responsive to said timing signals for generating said error signal for said first memory only if said mismatch indication is present at said predetermined points in the accessing of said second memory.

12. The arrangement of claim 7 further comprising third access means responsive to said control information and to said access signal for generating and applying a third set of signals to said second memory to access predetermined bits of a word identified by said control information, fourth access means responsive to said control information and to said access signal for generating and applying a fourth set of signals to said second memory to access the remaining bits of the word identified by said control information, third parity means for computing parity over said third set of signals, fourth parity means for computing parity over said fourth set of signals, means for comparing said parities computed by said third and fourth parity means and for providing a mismatch indication for said second memory if said last-mentioned parities do not match, and second memory error signal generating means responsive to said access signal and to said last-mentioned mismatch indication for generating an error signal for said second memory.

13. The arrangement of claim 12 further comprising timing means for providing timing signals at predetermined points in the accessing of said second memory, and wherein said first memory error signal generating means is also responsive to said timing signals and generates said error signal for said first memory only at said predetermined points, and wherein said second memory error signal generating means is also responsive to said timing signal and generates said error signal for said second memory only at said predetermined points.

14. In an information system comprising first and second memories, a diagnostic arrangement for checking the apparent operability of said first memory during a period in which said first memory is not being accessed, which comprises, a source of control information for said first and second memories, means for providing a nonaccess indication indication that said first memory is not being accessed, access means responsive to said control information in the absence of said nonaccess indication for generating and then applying a set of signals to said first memory to control the accessing of information in said first memory, said access means also being responsive to said nonaccess indication for causing said set of signals to assume predetermined states, simulation means for indicating the expected predetermined states of said set of signals, means connected to said simulation means and to said access means for comparing said expected predetermined states with the actual states of said set of signals as applied to said first memory by said access means, and for providing a mismatch indication if said compared expected and actual states do not match, and error signal generator means jointly responsive to said mismatch indication and to said nonaccess indication for generating an error signal for said first memory.

15. The arrangement of claim 14 wherein said first memory comprises a plurality of memory planes each comprising decoding circuits and a matrix of semiconductor storage elements; wherein said control information includes a read indication, a write indication, a refresh indication, an address identifying one or more storage elements in each of said memory planes, an enable signal and a start signal; and wherein said access means comprises buffer means for temporarily storing said control information, logic means for logically combining at least some of said control information to generate at least some signals of said set of signals, and a plurality of leads connecting said buffer and logic means with each of said memory planes for applying said set of signals thereover.

16. In an information system, a diagnostic arrangement for checking the accessing of a memory including storage elements storing information which must be periodically refreshed to maintain the viability of such information, which comprises a source of control information comprising an access indication specifying whether or not said memory is to be accessed for either a read or write operation, and a refresh indication specifying whether or not said memory is to be accessed for a refresh operation, first access means, including buffer and logic means, responsive to said control information for generating and then applying a first set of signals to said memory to control the accessing of information in a predetermined portion of said memory if said control information specifies that said memory is to be accessed for a read, write, or refresh operation; and if said control information specifies that said memory is not to be accessed, said first access means for causing said first sset of signals to assume predetermined states and then for applying said predetermined first set of signals to said memory to inhibit the accessing of said predetermined memory portion, second access means, including buffer and logic means, responsive to said control information for generating and then applying a second set of signals to said memory to control the accessing of information in the remaining portion of said memory if said control information specifies that said memory is to be accessed for a read, write, or refresh operation; and if sadi control information specifies that said memory is not to be accessed, sadi second access means for causing said second set of signals to assume said predetermined states and then for applying said predetermined second set of signals to said memory to inhibit the accessing of said remaining memory portion, first parity generator means for computing parity over said first set of signals, second parity generator means for computing parity over said second set of signals, means for comparing said parities computed by said first and second parity generator means and for generating a mismatch signals when said parities do not match, means for providing an indication that another memory is to be accessed, a source of timing signals each indicating a timing point in the accessing of said memory or said other memory, means jointly responsive to specified ones of said timing signals and to said mismatch signal for generating a timed mismatch indication whenever a mismatch signal is present at one of said timing points indicated by one of said specified timing signals, first logic means jointly responsive to said timed mismatch indication and to said access indication for providing a first error signal if said access indication specifies that said memory is to be accessed for a read or write operation, second logic means jointly responsive to said timed mismatch indication and to said refresh indication for providing a second error signal if said refresh indication specifies that said memory is to be accessed for a refresh operation, and third logic means jointly responsive to said timed mismatch indication and to said indication that another memory is to be accessed for generating a third error signal.

17. The arrangement of claim 16 further comprising means responsive to said first error signal for inhibiting the generation of an all-seems-well signal which normally accompanies the accessing of said memory for a read or write operation.

18. The arrangement of claim 16 further comprising means responsive to either said second or third error signals for inhibiting the transfer of information read from said memory.

19. The arrangement of claim 16 wherein said memory comprises a plurality of memory planes each containing a plurality of said storage elements, and wherein said predetermined portion of said memory includes predetermined ones of said memory planes and said remaining portion of said memory includes the remaining ones of said memory planes.

20. For use with the diagnostic arrangement of claim 16, apparatus for checking during a refresh operation the operability of both said parity generator means, said comparing means, and said second logic means, which comprises means connected to said first access means for forcing at least one irrelevant bit of said control information applied to said first access means to a different state then is applied to said second access means, said first access means responsive thereto for applying said at least one irrelevant bit to said memory as at least one signal of said first set of signals, and means for storing said second error signal if generated by said second logic means.

21. The diagnostic arrangement in accordance with claim 16 wherein said timed mismatch generating means comprises storage menas for storing information specifying the timing signals, if any, during which said timed mismatch indication can be generated, means responsive to said last-mentioned stored information and to each of said specified timing signals for generating an intermediate timing signal, and means jointly responsive to each of said intermediate timing signals and to said mismatch signal for generating said timed mismatch indication.

* * * * *

UNITED STATES PATENT AND TRADEMARK OFFICE
CERTIFICATE OF CORRECTION

PATENT NO. : 3,982,111
DATED : September 21, 1976
INVENTOR(S) : Edward M. Lerner, David C. Peterson,
Terrence T. Quin and Bernard G. Ruel It is certified that error appears in the above-identified patent and that said Letters Patent are hereby corrected as shown below:

Column 1, line 45, "Aug. 19" should read --Aug. 10--.
Column 2, line 7, after "3,944,800," insert --issued March 16, 1976--; line 11, "signal" should read --signals--; line 51, "circuits" should read --circuit--. Column 3, line 9, "is" should read --in--; line 61, "out" should read --our--.
Column 4, line 52, after "1974" insert --now U.S. Patent 3,964,030, issued June 15, 1976--. Column 5, line 14, "A" should read --As--. Column 6, line 60, delete "OMP2-3"(second occ.)
Column 7, line 57, "OMP45-47" should read --OMP46-47--.
Column 10, line 18, "according" should read --accordance--; line 58, "the" should read --that--. Column 12, line 13 "gated" should read --gates--; line 17, "mathc" should read --match--; line 40, "start" should read --state--. Column 13, line 39, "times" should read --time--; line 50, "MOSMATCH5" should read --MISMATCH5--. Column 15, line 1, "access" should read --accesses--; line 29, "MOD A" should read --MOD_A--; line 30, "MOD B" should read --MOD_B--. Column 16, line 18, "OGORE5" should read --IGORE5--; line 21, "had" should read --has--; line 37, "OS" should read --OS_--; line 38, "IGORE" should read --IGORE_--; line 49, "MODSEL" should read --MODSEL_--.
Column 17, line 23, "is" should read --as--; line 26, "OGOREO" should read --IGOREO--; line 30, "OGOREO" should read --IGOREO--. Column 18, line 13, "OGORE4" should read --IGORE4--
line 21, "HOGH" should read --HIGH--; line 25 "OGORE5" should read --IGORE5--. Column 20, line 1, "said" should read --and--; line 8, "induct" should read --induce--. Column 21, line 59, "indication", second occurrence, should read --indicating--.

UNITED STATES PATENT AND TRADEMARK OFFICE
CERTIFICATE OF CORRECTION

PATENT NO. : 3,982,111
DATED : September 21, 1976
INVENTOR(S) : Edward M. Lerner, David C. Peterson, Terrence T. Quin and Bernard G. Ruel It is certified that error appears in the above-identified patent and that said Letters Patent are hereby corrected as shown below:

Column 22, line 50, "sset" should read --set--; line 62, "sadi" should read --said--; line 63, "sadi" should read --said--.
Column 23, line 7, "signals" should read --signal--; line 25, "responstive" should read --responsive--. Column 24, line 30, "menas" should read --means--.

Signed and Sealed this

Twenty-second Day of February 1977

[SEAL]

Attest:

RUTH C. MASON
*Attesting Officer*

C. MARSHALL DANN
*Commissioner of Patents and Trademarks*